United States Patent [19]

Busacca et al.

[11] 4,300,105

[45] Nov. 10, 1981

[54] TWO-CAVITY KLYSTRON OSCILLATOR

[75] Inventors: Guido Busacca; Antonio Muratore, both of Palermo, Italy

[73] Assignee: Societa Italiana Telecomunicazioni Siemens S.p.A., Milan, Italy

[21] Appl. No.: 114,293

[22] Filed: Jan. 22, 1980

[30] Foreign Application Priority Data

Jan. 24, 1979 [IT] Italy .............................. 19550 A/79

[51] Int. Cl.[3] ......................... H01J 25/10; H03B 9/04

[52] U.S. Cl. .................................... 331/83; 315/5.44; 315/5.52

[58] Field of Search ............. 331/83, 81; 315/5, 5.39, 315/5.44, 5.52, 5.43, 5.46, 5.47, 5.48

[56] References Cited

U.S. PATENT DOCUMENTS

| | | | |
|---|---|---|---|
| 2,754,448 | 7/1956 | Van Iperen | 315/5.52 X |
| 3,488,550 | 1/1970 | Oltman, Jr. | 315/5.43 X |
| 4,209,755 | 6/1980 | Busacca et al. | 331/83 |

*Primary Examiner*—Siegfried H. Grimm
*Attorney, Agent, or Firm*—Karl F. Ross

[57] ABSTRACT

A klystron oscillator has an input cavity resonant in a $TM_{010}$ mode and a larger output cavity resonant in a $TM_{0n0}$ mode where n is an integer greater than 1, preferably equal to 2. The input cavity, with re-entrant bosses defining a buncher gap, projects into the output cavity to form one of two re-entrant bosses thereof defining a catcher gap.

4 Claims, 1 Drawing Figure

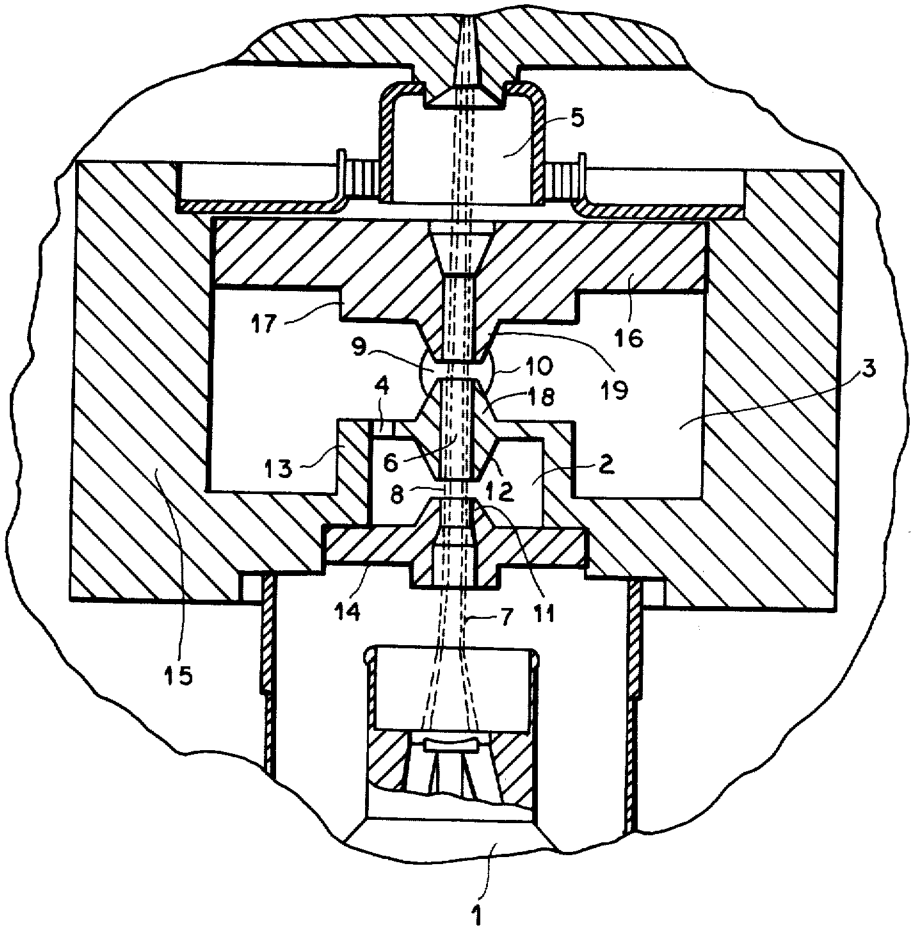
5
17
16
9
10
19
3
4
18
13
6
2
8
12
11
14
7
15
1

TWO-CAVITY KLYSTRON OSCILLATOR

FIELD OF THE INVENTION

Our present invention relates to a klystron oscillator of the type having two resonant cavities centered on a common axis and coupled to each other by a feedback connection offset from that axis.

BACKGROUND OF THE INVENTION

As is well known, a klystron oscillator of the type referred to includes electrodes (i.e. a cathode and an anode) between which an electron beam successively traverses the two cavities, passing through a buncher gap in the input cavity and then through a catcher gap in the output cavity. The electric field set up across the buncher gap modulates the velocity of the beam electrons which then pass through a drift space into the catcher gap where the resulting density variations give rise to electromagnetic oscillations fed back to the buncher gap. The oscillating frequency is determined by the dimensions of the two resonant cavities but, generally, is also subject to some variation in response to changes of the d-c biasing voltage across the electron-emitting cathode and the electron-collecting anode. This voltage dependence of the oscillator frequency is referred to in the art as "frequency pushing".

The frequency stability of such an oscillator is a function of the quality or Q factor of the output cavity and also varies generally inversely with the length of the drift space. To increase the Q factor, and thus to minimize the pushing effect and the attendant noise, it has already been proposed to couple a further resonant cavity to the output cavity or to insert such an additional cavity in the feedback path between the input and output cavities. These prior solutions of the problem of frequency stabilization, however, greatly complicate the structure of the klystron and increase its overall dimensions as well as its cost.

OBJECT OF THE INVENTION

The object of our present invention, therefore, is to provide a simplified klystron structure designed to generate a stable oscillatory frequency with low noise.

SUMMARY OF THE INVENTION

We realize this object, in accordance with our present invention, by so dimensioning the input and output cavities of the klystron that the former resonates in a $TM_{010}$ mode while the latter resonates in $TM_{0n0}$ mode where n is an integer greater than 1, preferably equal to 2.

Pursuant to another feature of our invention, a particularly compact klystron structure is obtained by letting the smaller input cavity project into the larger output cavity, this arrangement also reducing the length of the drift space lying between the buncher and catcher gaps respectively formed between confronting re-entrant formations in these cavities.

BRIEF DESCRIPTION OF THE DRAWING

The above and other features of our invention will now be described in detail with reference to the accompanying drawing the sole FIGURE of which shows, in axial section, the major part of a two-cavity klystron embodying our present improvement.

SPECIFIC DESCRIPTION

As shown in the drawing, a cathode 1 emits an electron beam 7 toward an anode 5 along the common axis of two cylindrical cavities 2 and 3. Input cavity 2, which is resonant in the $TM_{010}$ mode, is formed by a metallic cup 13 projecting into the output cavity 3, the latter being dimensioned to resonate in the $TM_{020}$ mode. At its bottom, cavity 2 is bounded by a metallic disk 14 carrying an internal boss 11 which confronts a similar boss 12 on the opposite end of cavity 2, these two bosses being axially perforated and carrying the usual grids defining between them a buncher gap 8 traversed by electron beam 7. Cup 13 is integral with a housing 15 which forms the peripheral boundary of cavity 3, the latter being bounded by a metallic disk 16 having a shoulder 17 of the same diameter as cup 13 but of lesser axial height. Two confronting, axially perforated bosses 18 and 19 on cup 13 and shoulder 17 have grids defining between them a catcher gap 9 in line with buncher gap 8. Cavity 3 has an output port 10 emitting the generated oscillations.

Between gaps 8 and 9 the electron beam 7 passes through a cylindrical drift space 6 formed by the two oppositely extending bosses 12 and 18 of cup 13. This drift space is relatively short, on the order of half the axial height of cavity 3 in the embodiment illustrated, thanks to the fact that the cup 13 forming the cavity 2 projects with its boss 18 more than half-way into cavity 3 in order to locate the gap 9 in a region where the electric-field gradient is high. The two cavities are coupled to each other through a feedback aperture 4.

With the wall of input cavity 2 forming part of the two re-entrant formations 13, 18 and 17, 19 defining the gap 9 of cavity 3, in a manner analogous to that in which formations 11 and 12 define the gap 8 of cavity 2, we obtain a very compact structure for a high-Q oscillator of stable operating frequency.

We claim:

1. A klystron oscillator comprising:

a conductive housing forming an input cavity and an output cavity with respective pairs of confronting re-entrant formations defining a first gap and a second gap interconnected by a drift space and centered on a common axis, said input cavity being resonant in a $TM_{010}$ mode, said output cavity being resonant in a $TM_{0n0}$ mode, n being an integer greater than 1, said cavities being coupled to each other by a feedback connection offset from said axis;

electrode means generating an electron beam traversing said first gap, said drift space and said second gap in succession; and output means coupled with said second cavity.

2. A klystron oscillator as defined in claim 1 wherein said first cavity projects into said second cavity and forms part of one of said re-entrant formations of the latter.

3. A klystron oscillator as defined in claim 2 wherein the other of said re-entrant formations of said second cavity has an axial height smaller than that of said first cavity.

4. A klystron oscillator as defined in claim 1, 2 or 3 wherein $n=2$.

* * * * *